(12) United States Patent
Hwang et al.

(10) Patent No.: US 7,137,045 B2
(45) Date of Patent: Nov. 14, 2006

(54) DECODING METHOD AND APPARATUS THEREFOR

(75) Inventors: Sung-hee Hwang, Seoul (KR); Yoon-woo Lee, Suwon-si (KR); Sung-hyu Han, Seoul (KR); Sang-hyun Ryu, Suwon-si (KR); Young-im Ju, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 540 days.

(21) Appl. No.: 10/347,524

(22) Filed: Jan. 21, 2003

(65) Prior Publication Data

US 2003/0145274 A1   Jul. 31, 2003

(30) Foreign Application Priority Data

Jan. 23, 2002   (KR)   .................... 10-2002-0003856

(51) Int. Cl.
*G06F 11/00* (2006.01)

(52) U.S. Cl. .................. 714/703; 714/772; 714/822

(58) Field of Classification Search ............... 714/703, 714/755, 769, 772, 822, 791, 800, 758, 799, 714/785

See application file for complete search history.

(56) References Cited

U.S. PATENT DOCUMENTS

| | | | | |
|---|---|---|---|---|
| 4,975,915 A | * | 12/1990 | Sako et al. ................. | 714/755 |
| 5,886,654 A | * | 3/1999 | Ichikawa et al. ............. | 341/94 |
| 5,974,529 A | * | 10/1999 | Zumkehr et al. ............. | 712/41 |
| 6,047,395 A | * | 4/2000 | Zook .......................... | 714/756 |
| 6,115,837 A | * | 9/2000 | Nguyen et al. ............. | 714/769 |
| 6,154,866 A | * | 11/2000 | Kawahara et al. .......... | 714/755 |
| 6,378,103 B1 | * | 4/2002 | Han ............................ | 714/769 |

FOREIGN PATENT DOCUMENTS

| | | |
|---|---|---|
| JP | 07-202717 | 8/1995 |
| JP | 09-259546 | 10/1997 |

\* cited by examiner

*Primary Examiner*—Albert DeCady
*Assistant Examiner*—Fritz Alphonse
(74) *Attorney, Agent, or Firm*—Stein, McEwen & Bui, LLP

(57) ABSTRACT

A decoding method and an apparatus operate by performing error correction on code words of an error correcting code block in one direction selected from a row direction and a column direction, indicating in error flags the remaining code words except at least some code words from code words having uncorrectable errors, and performing error correction on code words in the other direction based on the error flags. Accordingly, errors that have been conventionally considered as being uncorrectable may now be corrected.

30 Claims, 9 Drawing Sheets

DECODING METHOD AND APPARATUS THEREFOR

CROSS-REFERENCE TO RELATED APPLICATIONS

This application claims the benefit of Korean Patent Application No. 2002-3856, filed Jan. 23, 2002, in the Korean Intellectual Property Office, the disclosure of which is incorporated herein by reference.

BACKGROUND OF THE INVENTION

1. Field of the Invention

The present invention relates to a decoding method and apparatus, and more particularly, to a method and apparatus for correcting an error of an error correcting code (ECC) block read from an information storage medium.

2. Description of the Related Art

Data such as an image or sound is stored in discs such as compact discs (CDs) or digital versatile discs (DVDs) which are information storage media. A pickup provided in a reproducing apparatus emits a laser beam to a disc and receives the laser beam reflected from the disc to read data stored in the disc.

During operation and use, optical discs are easily scratched, or contaminant such as dust easily sticks to the surface of the optical discs. Accordingly, a probability of error burst is high when data is read from an optical disc. To overcome this problem, during recording, data is encoded into ECC blocks so that errors which may occur while the data is read can be corrected.

A reproducing apparatus performs error correction on ECC blocks read from the disc on row/column code words. Row/column code words on which an error occurs are indicated by error flags, and then error correction is performed on column/row code words based on the error flags.

In a case of a DVD, in which the length of a row code word is 182 bytes, including 10 bytes of parity, if errors occur in more than 6 bytes from the 182 bytes of the row code word, a decoder of a reproducing apparatus indicates the row code word in an error flag. Error correction on a column code word is performed based on the error flag resulting from the error correction on the row code word. When error correction is performed on the column code word, errors are deemed to have occurred in all bytes of the row indicated in the error flag. Since the error flag is generated only if errors occur in more than 6 bytes among the 182 bytes, a number of bytes that are normally read without errors is generally greater than a number of bytes having errors. However, when error correction is performed on the column code word, all of the 182 bytes of the row code word indicated in the error flag are considered to have errors. Accordingly, even if a code word is actually correctable, it is deemed that the code word cannot be corrected, thus decreasing error correction efficiency.

SUMMARY OF THE INVENTION

The present invention provides a method and an apparatus for increasing error correction efficiency by improving how an error flag is generated.

Additional aspects and/or advantages of the invention will be set forth in part in the description which follows and, in part, will be obvious from the description, or may be learned by practice of the invention.

According to an aspect of the present invention, a method decodes data which has been encoded. The method includes performing error correction on code words of an error correcting code block in one direction selected from a row direction and a column direction, indicating in error flags remaining code words except at least some code words from code words having uncorrectable errors, and performing error correction on code words in the other direction based on the error flags.

The indicating in error flags the remaining code words except at least some code words from code words having uncorrectable errors includes indicating two sequential code words in error flags when uncorrectable errors consecutively occur in at least said two sequential code words or ignoring uncorrectable errors which do not consecutively occur in at least three sequential code words, and when uncorrectable errors consecutively occur in at least three sequential code words, ignoring uncorrectable errors occurring in a top code word and a bottom code word of the at least three sequential code words and indicating an at least one remaining code word in an error flag. In performing error correction on code words in the other direction, it is deemed that uncorrectable errors occur throughout data, including each of the code words indicated in the error flags.

According to another aspect, a method decodes data which has been encoded by performing error correction on code words of an error correcting code block in a row direction, indicating in error flags code words having uncorrectable errors, performing error correction on code words of the error correcting code block in a column direction based on the error flags, indicating in error flags a remaining code word/words except at least some from the code words having the uncorrectable errors obtained in the row direction, and performing error correction on the code words of the error correcting code block in the column direction based on the error flags obtained by the indicating in error flags the remaining code words except at least some code words from code words having uncorrectable errors.

The method also includes indicating in error flags code words having uncorrectable errors; and performing error correction on code words of an error correcting code block in a row direction based on the error flags obtained by indicating in error flags code words having uncorrectable errors.

The indicating in error flags a remaining code word/words except at least some from the code words having the unconnectable errors includes when uncorrectable errors occur in at least two sequential code words, indicating the two sequential code words in error flags, or ignoring uncorrectable errors which do not consecutively occur in at least three sequential code words, and when uncorrectable errors consecutively occur in at least three sequential code words, ignoring uncorrectable errors occurring in a top code word and a bottom code word of the at least three sequential code words and indicating an at least one remaining code word in an error flag.

According to still another aspect, an apparatus includes a reader, which reads data from an information storage medium, a modulator, which performs channel demodulation on the read data, and a decoder. The decoder generates an error correcting code block from the demodulated data, performs error correction on code words of the error correcting code block in one direction of a row direction and a column direction, indicates in error flags a remaining code word/words except at least some code words from code words having uncorrectable errors, and performs error correction on code words in the other direction based on the error flags.

The decoder indicates two sequential code words in error flags when uncorrectable errors consecutively occur in at least said two sequential code words. Alternatively, the decoder ignores uncorrectable errors which do not occur consecutively in at least three sequential code words, and when uncorrectable errors consecutively occur in at least three sequential code words, the decoder ignores uncorrectable errors occurring in the top and bottom code words of said at least three sequential code words and indicates a remaining code word/words) in an error flag. Furthermore, the decoder performs error correction on the code words in the other direction, deeming that uncorrectable errors occur throughout data included in each of the code words indicated in the error flags.

According to still another aspect, an apparatus includes an error correcting code (ECC) block generator, which generates an ECC block, an error corrector, which performs error correction on code words of the ECC block in a row direction, indicates in error flags code words having uncorrectable errors, performs error correction on code words of the error correcting code block in a column direction based on the error flags, and performs error correction again on the code words of the error correcting code block in the column direction based on error flags resulting from error flag management, and a flag managing unit, which indicates in error flags remaining code words except at least some from the code words having the uncorrectable errors resulting from the error correction performed on the code words in the row direction.

The flag managing unit indicates two sequential code words in error flags when uncorrectable errors consecutively occur in at least said two sequential code words. Alternatively, the flag managing unit ignores uncorrectable errors which do not occur consecutively in at least three sequential code words, and when uncorrectable errors consecutively occur in at least three sequential code words, the flag managing unit ignores uncorrectable errors occurring in a top code word and a bottom code word of the at least three sequential code words and indicates a remaining code word/words in an error flag.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Before setting forth the invention, terms used in this specification will be described.

An "error flag" is generated when an error whose location is not identified, occurs. An "erase flag" is generated when an error whose location is identified, occurs. "Erase correction" indicates correction of an error whose location is identified. Usually, correction of an error whose location is identified, that is, erase correction, requires less parities than correction of an error whose location is not identified, that is, error correction in a narrow sense. "Error correction" in this specification is used in a broad sense, including erase correction as well as error correction in a narrow sense.

"Erase information" is information about an error flag generated after error correction is performed on a code word. When there are 208 row code words, erase information obtained after error correction is performed on the 208 row code words has 208 bits. Whether an error flag is generated for a code word based on the erase information can be determined. All bytes of a code word for which an error flag is generated are considered as having errors in the next error correction.

Figure 1:
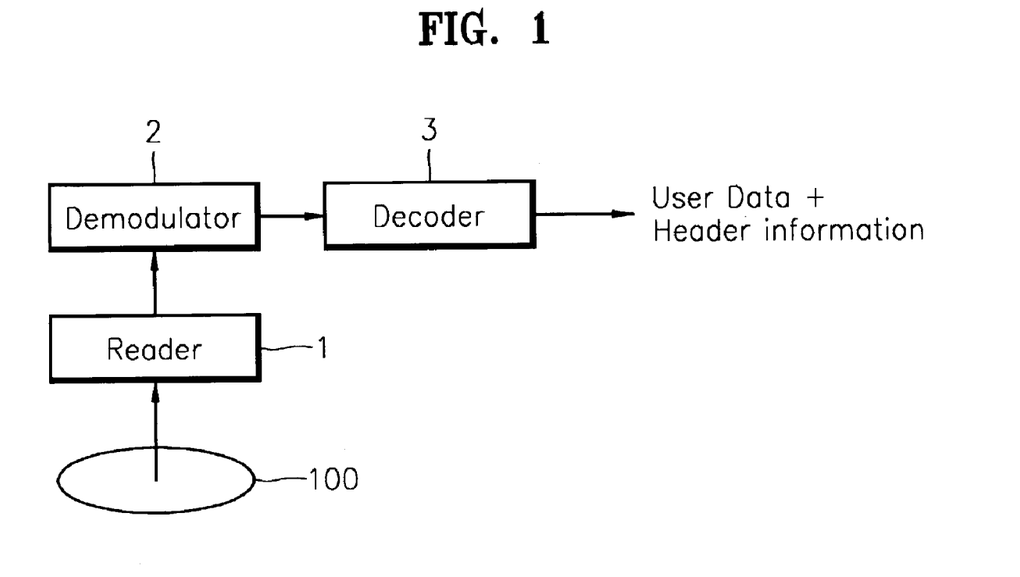
FIG. 1 is a block diagram of an error correction apparatus according to an embodiment of the present invention.

FIG. 1 is a block diagram of an error correction apparatus according to an embodiment of the present invention. Referring to FIG. 1, the error correction apparatus includes a reader 1, a demodulator 2, and a decoder 3. The reader 1 reads data from a disc 100. The demodulator 2 demodulates the data read by the reader 1. Generally, data is recorded through channel modulation, so that demodulation usually indicates channel demodulation. When data is recorded on the disc 100, the data is encoded in a manner that allows an error burst occurring while the data is read to be detected and corrected efficiently. The decoder 3 performs error correction on the channel-modulated data according to the present invention and outputs decoded user data and header information.

Figure 2:
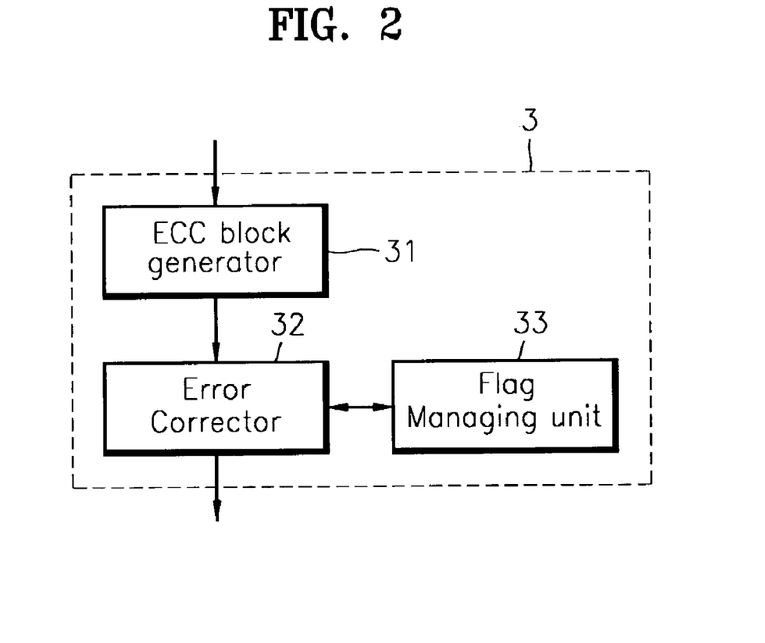
FIG. 2 is a detailed block diagram of an embodiment of the decoder of FIG. 1.

FIG. 2 is a detailed block diagram of an embodiment of the decoder 3 of FIG. 1. Referring to FIG. 2, the decoder 3 includes an error correcting code (ECC) block generator 31, an error corrector 32, and a flag managing unit 33. The ECC block generator 31 arranges channel-demodulated data in the form of an ECC block including row code words and column code words.

The flag managing unit 33 manages generation of an error flag based on the result of error correction performed by the error corrector 32. When four-step error correction is performed on an ECC block in the order row code words, column code words, row code words, and column code words, error flags are generated according to a conventional method in first and second operations, but in a third operation, error flags are generated for the remaining code words except at least some among the code words in which uncorrectable errors have occurred, based on the result of error correction on the row code words performed in the first operation. The order and the number of times of error correction may vary, if necessary. A more detailed managing way will be described later.

The error corrector 32 performs error correction on an input row or column code word. When the error corrector 32 performs error correction based on the result of previous error correction, error correction is performed according to an error flag generated by the flag managing unit 33. In other words, the error corrector 32 performs error correction, considering entire data of a row or column code word indicated in an error flag as being erroneous.

Figure 3:
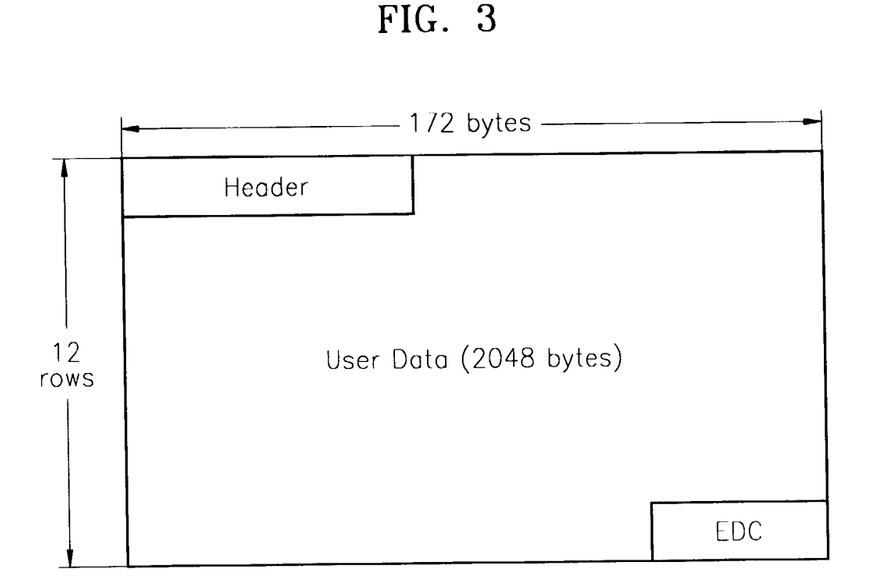
FIG. 3 is a diagram of an embodiment of a data structure of a single sector in an error correcting code (ECC) block.

FIG. 3 is a diagram of a data structure of an embodiment of a single sector in an ECC block. Referring to FIG. 3, in an embodiment of the present invention, a single sector has a size of 12 rows×172 bytes and is composed of 2048 bytes of user data, header data, and error detection code (EDC) data.

Figure 4:
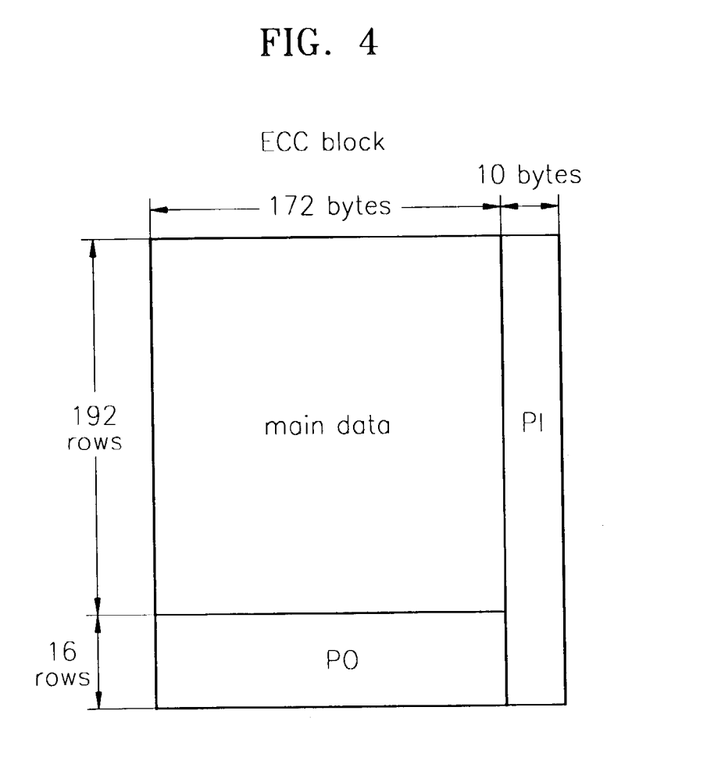
FIG. 4 is a diagram of an embodiment of a data structure of an ECC block.

FIG. 4 is a diagram of an embodiment of a data structure of an ECC block. Referring to FIG. 4, after assigning 16 sectors to store main data, the 16 sectors having a size of 192 rows×172 bytes, 16 rows of outer parity (PO) are added to the 192 rows of main data, and 10 bytes of inner parity (PI) are added to each of the 208 rows to form a single ECC block.

Figure 5:
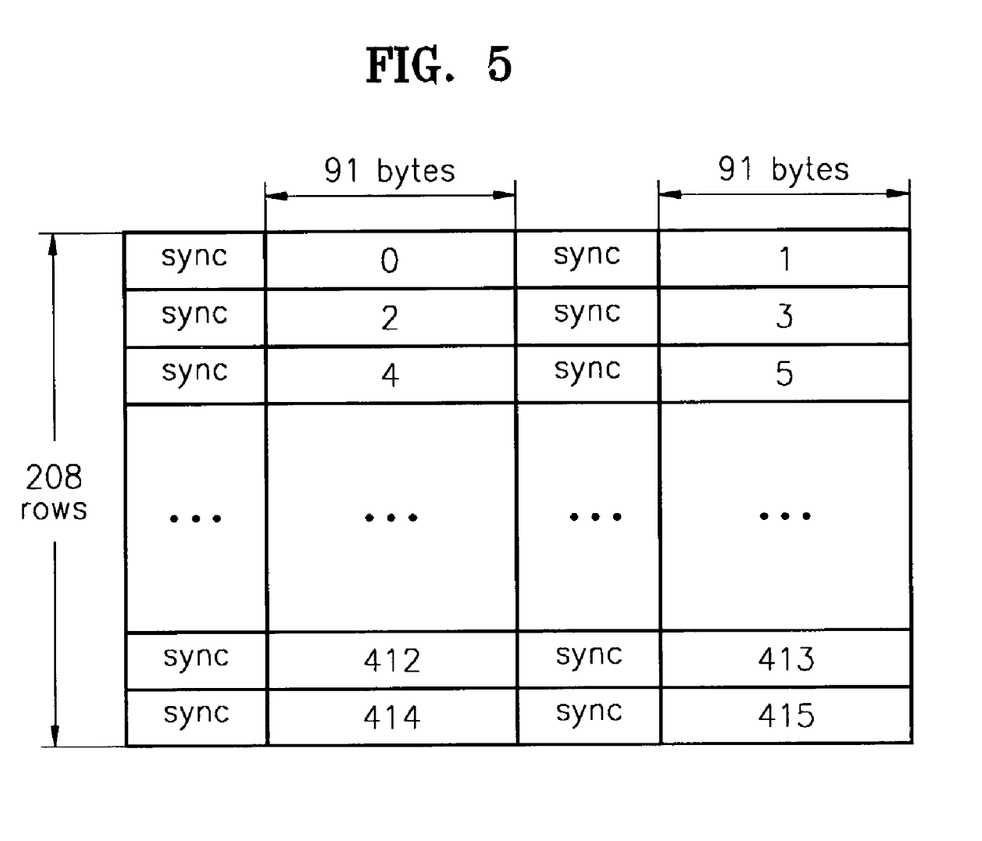
FIG. 5 is a diagram of an embodiment of a structure in which an ECC block is recorded on a disc.

FIG. 5 is a diagram of an embodiment of a structure in which an ECC block is recorded on the disc 100. Referring to FIG. 5, an ECC block is divided into 416 91-byte fractions, which are afterwards channel modulated. Then, sync data is added to each of the 416 modulated fractions, and then the 416 modulated fractions of the ECC block are recorded on the disc 100. Before the ECC block is divided into fractions, interleaving may be performed according to a predetermined interleaving algorithm. Interleaving is performed to scatter an error burst and is an encoding process in a broad sense. With such a process, a plurality of ECC blocks are sequentially recorded on the disc 100.

The reader 1 sequentially reads the data that has been recorded in the structure of FIG. 5 from the disc 100. The demodulator 2 removes sync data and performs channel demodulation. The ECC block generator 31 arranges demodulated data to form an ECC block as shown in FIG. 4. When interleaving has been performed on the ECC block during recording, deinterleaving is performed to form the ECC block.

Figure 6A:
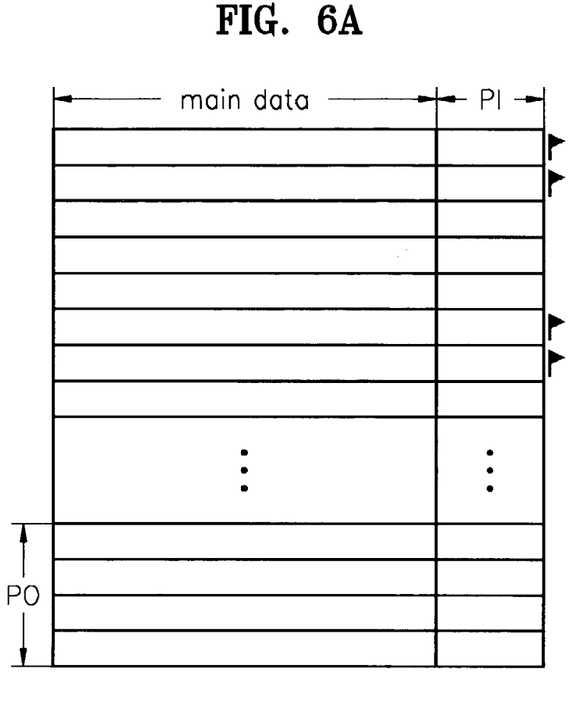
FIGS. 6A and 6B are diagrams illustrating how error flags influence next error correction.
Figure 6B:
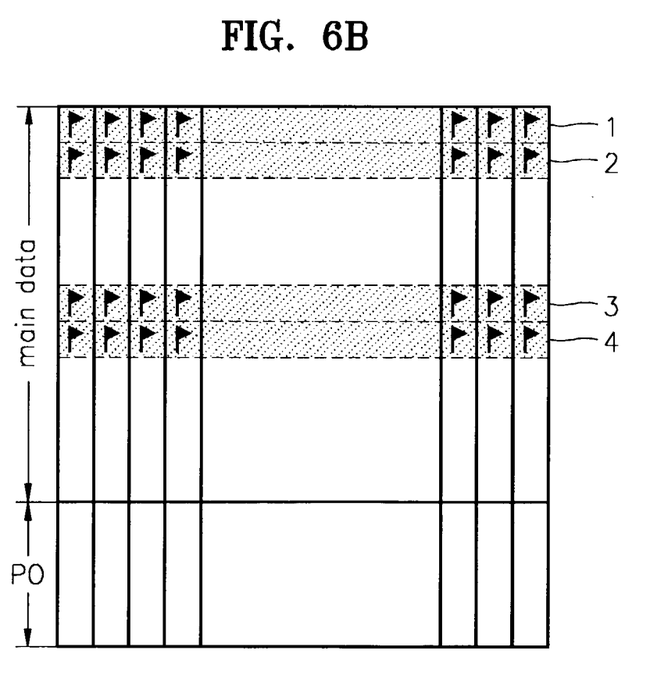

FIGS. 6A and 6B are diagrams illustrating how error flags influence next error correction. FIG. 6A shows error flags generated as a result of performing error correction on row code words of an ECC block. The error flags are generated as a result of management performed by the flag managing unit 33. A conventional method and a method according to an embodiment of the present invention are selectively used in each of the error correction processes. According to the conventional method, when more than a maximum error correctable number of bytes occur in each of code words, all of the code words are indicated in error flags. However, according to an embodiment of the present invention, the remaining code words except at least some of the code words that are deemed to have uncorrectable errors are indicated in error flags, which will be described below.

Next, error correction is performed on column code words based on the result shown in FIG. 6A. It is deemed that the data in each of row code words 1, 2, 3, and 4 of FIG. 6B is erroneous, so each of the bytes in the data is indicated in an erase flag. Besides errors which may occur while data in the remaining column is read, four errors (four bytes of error) have already occurred in each of the column code words. Although the number of parities required for erase correction is less than that required for correction of an error whose location is not identified, each of the column code words consumes parities necessary for two periods of erase correction. As described above, a result of previous error correction influences succeeding error correction.

If it is assumed that a row code word=(182, 172, 11), and errors no greater than 5 can be corrected, the error corrector 32 performs error correction when 5 or less errors occur in 182 symbols and indicates all of the 182 symbols in an error flag when 6 or more errors occur. If a column code word= (208, 192, 17), one parity is required for erase correction, and two parities are required for correcting an error whose location is not identified, 4 parities required for 4 erase corrections are subtracted from 16 parities, 12 parities remain, and 6 errors can be corrected using the 12 parities. Accordingly, if more than 6 errors occur, error correction is impossible.

Figure 7:
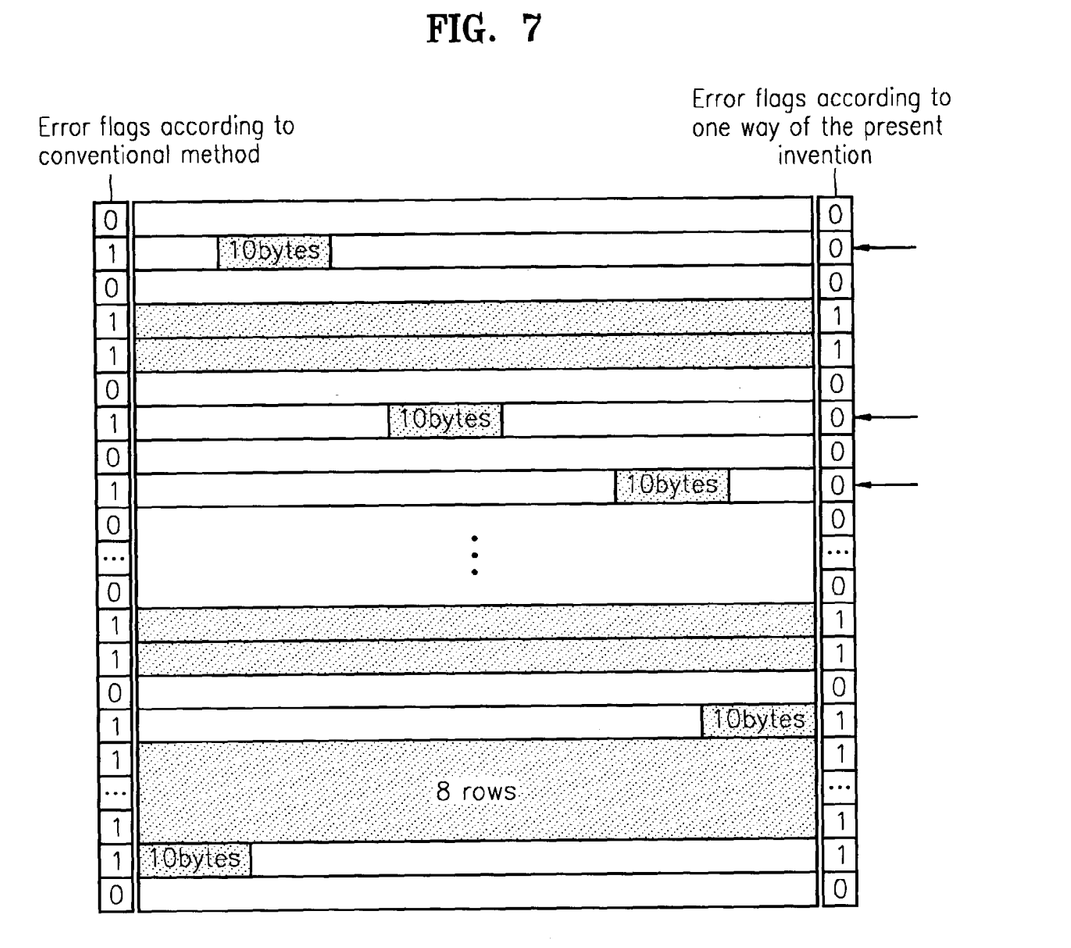
FIG. 7 is a diagram of error flags generated according to an embodiment of a managing way of the present invention.

FIG. 7 is a diagram of error flags generated according to an embodiment of a managing way of the present invention. Referring to FIG. 7, when error correction is impossible in a case where more than 5 errors occur in a row code word, the row code word is indicated in an error flag according to the conventional method even if only 10 bytes of error occur in the row code word. However, according to the managing way of the present invention, if errors do not occur consecutively in two rows, a current error is ignored. In other words, when at least two consecutive row code words are indicated in error flags, a current row code word is indicated in an error flag. Accordingly, the number of error flags for row code words decreases, and the number of errors which are considered as occurring during error correction on column code words decreases, thus increasing an error correction rate with respect to the column code words. In other words, in comparison with error correction performed on column code words based on error flags generated for row code words in a previous process according to the conventional method, error correction performed on the row code words based on error flags generated according to the managing way of the present invention can increase the number of column code words on which error correction is performed.

Figure 8:
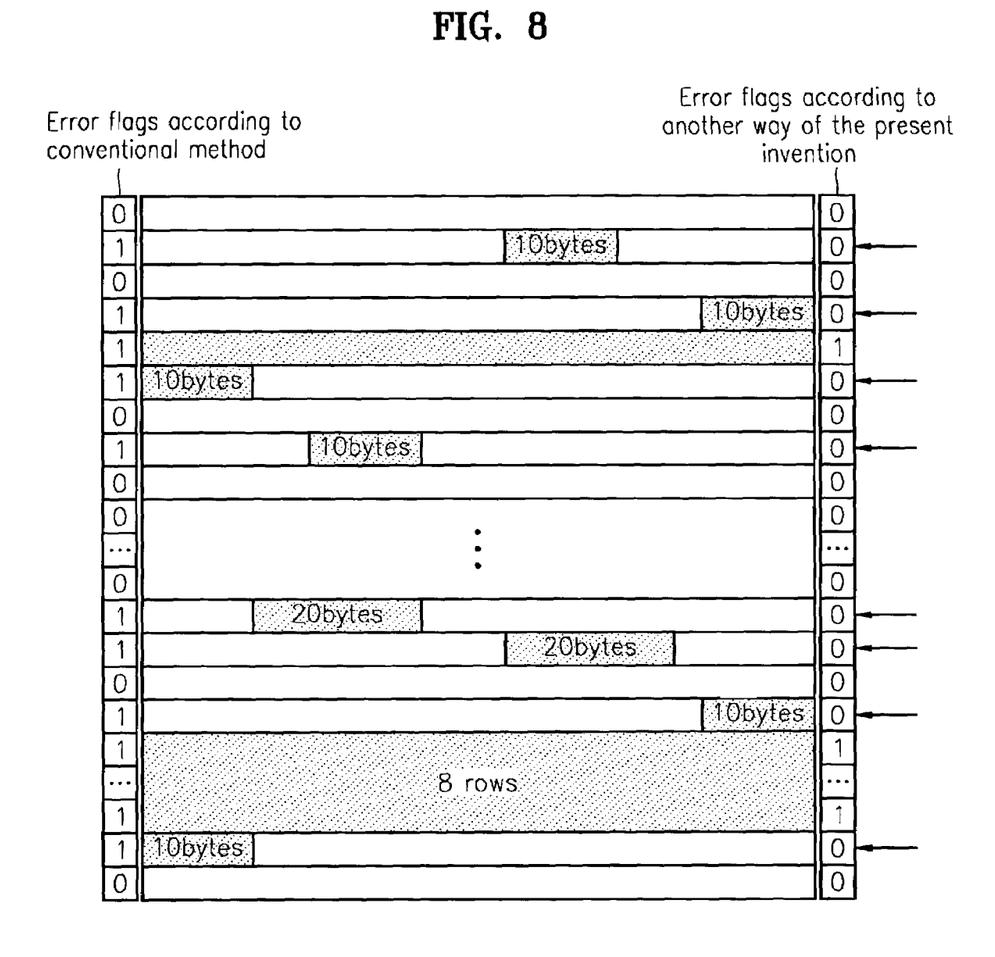
FIG. 8 is a diagram of error flags generated according to another embodiment of a managing way of the present invention.

FIG. 8 is a diagram of error flags generated according to another embodiment of a managing way of the present invention. Referring to FIG. 8, when error correction is impossible in a case where more than 5 errors occur in a row code word, the row code word is indicated in an error flag according to the conventional method even if only 10 bytes of error occur in the row code word. However, if errors do not occur consecutively in three rows, errors are ignored. If errors consecutively occur in three or more sequential row code words, errors occurring in a top row code word and a bottom row code word are ignored, and the remaining row code words are indicated in error flags. Accordingly, the number of error flags for row code words decreases, and the number of errors which are deemed to be occurring during error correction on column code words decreases, thus increasing an error correction rate with respect to the column code words. In other words, in comparison with error correction performed on column code words based on error flags generated for row code words in a previous process according to the conventional method, error correction performed on the row code words based on error flags generated may increase the number of column code words on which error correction is performed.

Figure 9:
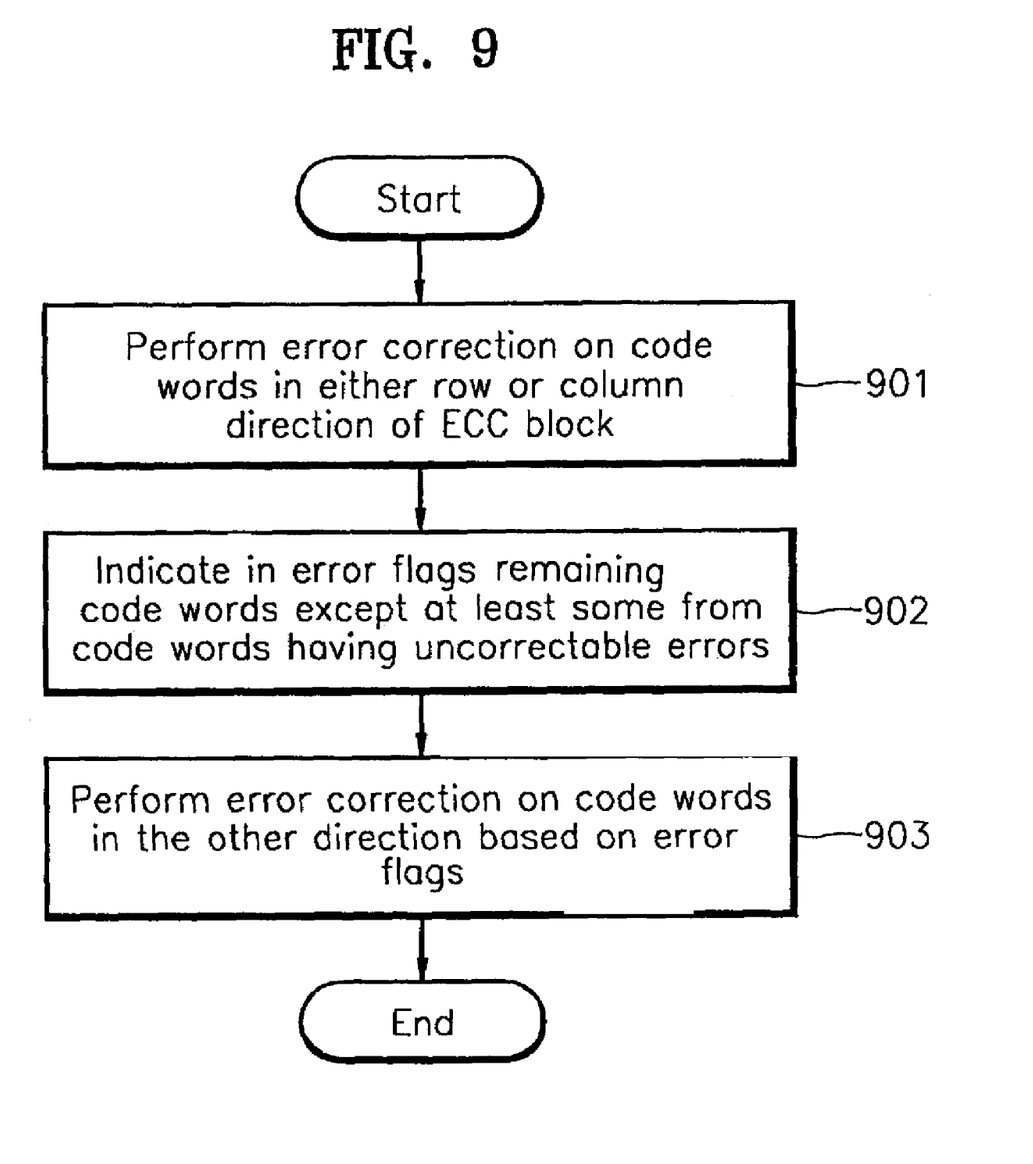
FIG. 9 is a flowchart of a decoding method according to an embodiment of the present invention.

A decoding method according to the present invention will be described below based on the above-described structure. FIG. 9 is a flowchart of a decoding method according to an embodiment of the present invention. Referring to FIG. 9, the decoder 3 of FIG. 1 performs error correction on code words in either a row or column direction of an ECC block in operation 901. Among code words that have been determined as having uncorrectable errors as the result of error correction, the remaining code words except at least some are indicated in error flags in operation 902. Error correction is performed on code words in the other direction based on the error flags in operation 903.

Figure 10:
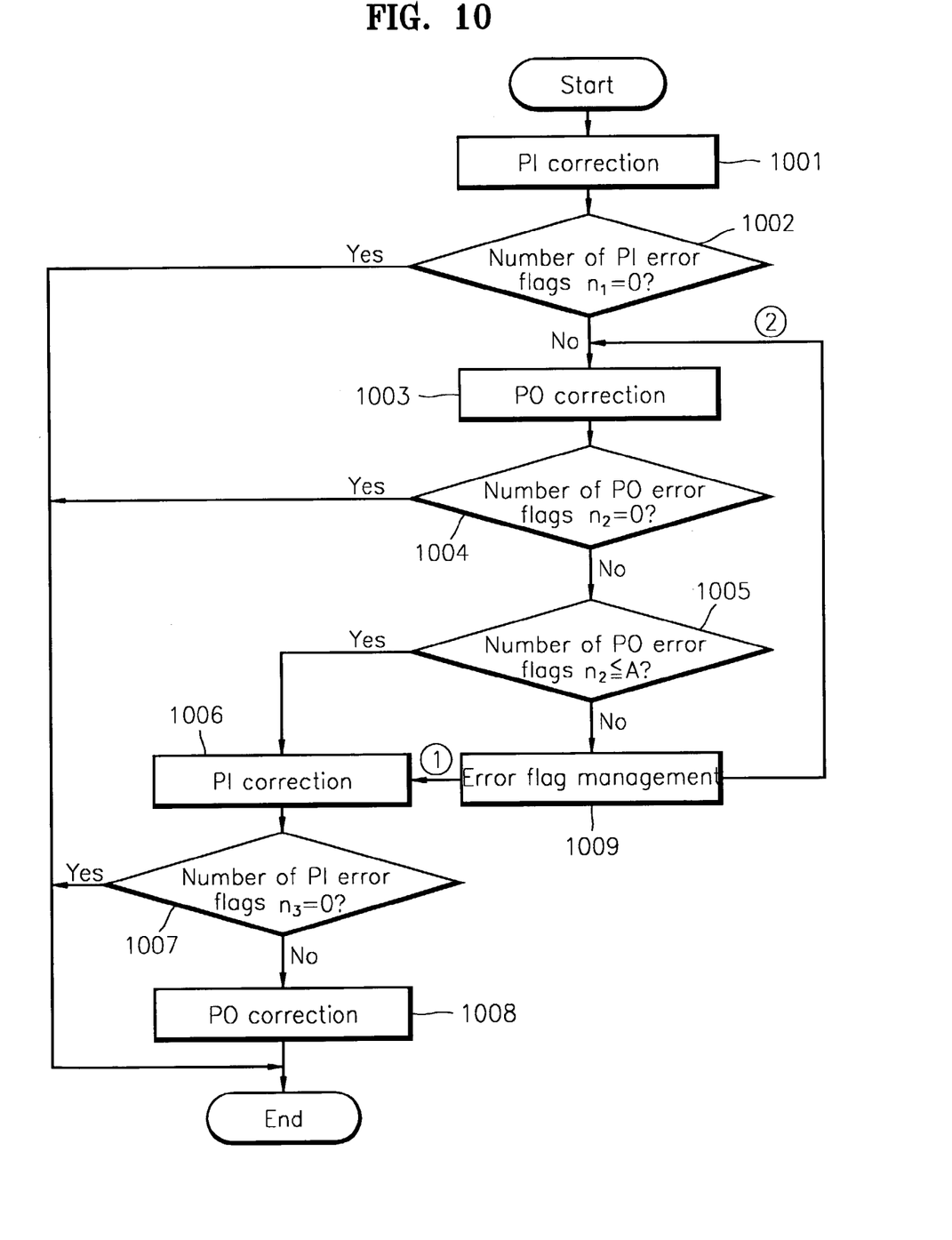
FIG. 10 is a flowchart of a decoding method according to another embodiment of the present invention.

FIG. 10 is a flowchart of a decoding method according to an embodiment of the present invention. Referring to FIG. 10, the ECC block generator 31 generates an ECC block, and the error corrector 32 performs error correction on row code words of the ECC block and indicates row code words having uncorrectable errors in error flags in operation 1001. Here, error flags are generated according to the conventional method. In other words, error flags are generated for all code words, each of which having errors exceeding a maximum correctable number of errors. The flag managing unit 33 stores information about the error flags, that is, erase information having as many bits as the number of the row code words, and counts the number of error flags. When it is determined that the number of error flags, $n_1$, is 0 in operation 1002, that is, when errors have been corrected, error correction need not continue to be performed, so error correction ends. When it is determined that the number of error flags, $n_1$, is non-zero in operation 1002, that is, when at least one error flag is generated, the error corrector 32 considers that all bytes of a corresponding code word have errors and performs error correction on column code words. Here, the error correction includes erase correction. Then, the error corrector 32 indicates code words having uncorrectable errors in error flags in operation 1003. The error flags are generated according to the conventional method. In other words, error flags are generated for all code words, each of which having errors exceeding a maximum correctable number of errors. The flag managing unit 33 stores information about the error flags, that is, erase information having as many bits as the number of the column code words, and counts the number of error flags. When it is determined that the number of error flags, $n_2$, is 0 in operation 1004, that is, when all errors have been corrected, error correction need not continue to be performed, so error correction ends.

When it is determined that the number of error flags, $n_2$, is non-zero in operation 1004, the flag managing unit 33 compares the number of error flags, $n_2$, with a maximum number A of errors which can be corrected by erase correction with respect to row code words. When it is determined that the number of error flags, $n_2$, is no greater than A in operation 1005, the error corrector 32 performs error correction on the column code words again and indicates column code words having uncorrectable errors in error flags in operation 1006. The flag managing unit 33 stores information about the error flags, that is, erase information having as many bits as the number of the row code words, and counts the number of error flags. When it is determined that the number of error flags, $n_3$, is 0 in operation 1007, that is, when all errors have been corrected, error correction is completed. When it is determined that the number of error flags, $n_3$, is non-zero in operation 1007, the error corrector 32 performs error correction on the column code words based on the error flags and indicates code words having uncorrectable errors in error flags in operation 1008, and terminates error correction.

Meanwhile, when it is determined that the number of error flags, $n_2$, is greater than the maximum number A of errors, which can be corrected by erase correction with respect to row code words, in operation 1005, the flag managing unit 33 performs error flag management in operation 1009. According to the result of error flag management, the procedure goes to PI correction in operation 1006 or PO correction in operation 1003.

Figure 11:
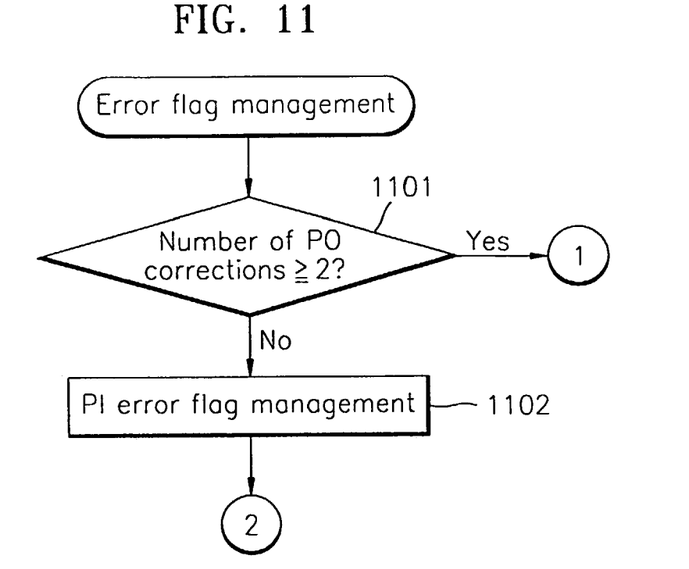
FIG. 11 is a flowchart of an embodiment of error flag management.

FIG. 11 is a flowchart of error flag management. Referring to FIG. 11, when it is determined that the number of error corrections performed on the column code words is at least 2 in operation 1101, the procedure goes to operation 1006 of FIG. 10. When it is determined that the number of error corrections performed on the column code words is less than 2 in operation 1101, the remaining row code words except at least some among the row code words, which are determined as having uncorrectable errors as the result of error correction performed on the row code words in operation 1001 of FIG. 10, are indicated in error flags in operation 1102. Next, the procedure goes to operation 1003 of FIG. 10 to perform error correction on the column code words based on the error flags newly generated in operation 1102. The erase information in which partial errors except burst errors in each of the row code words are ignored through the error flag management of operation 1102 is reflected when next error correction is performed on the column code words, so that an error correction rate increases.

Figure 12:
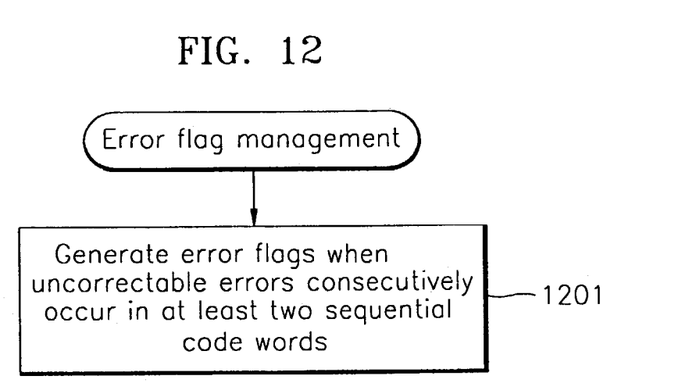
FIGS. 12 and 13 are flowcharts of two examples of embodiments of the error flag management of FIG. 11.
Figure 13:
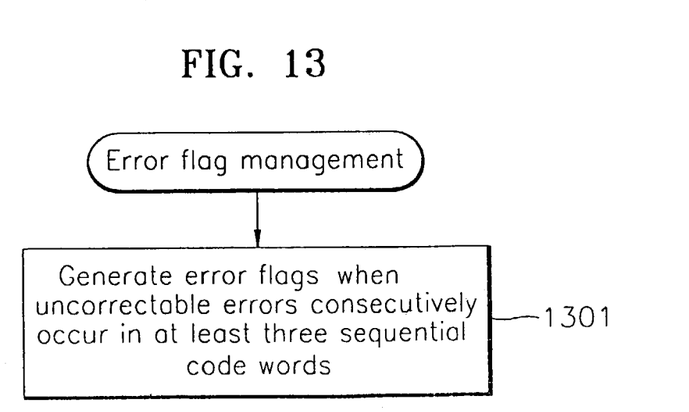

FIGS. 12 and 13 are flowcharts of two examples of embodiments of the error flag management of FIG. 11. Referring to FIG. 12, when uncorrectable errors occur in at least two consecutive code words, error flags are generated for the two code words, respectively, in operation 1201. When erase information based on error flags generated according to the conventional method is represented by Erase[i], and the erase information based on the error flags generated in operation 1201 is represented by Erase_Manager[i], the relationship between the two types of erase information may be expressed by Formula (1).

Erase_Manager[i]=Erase[i], i=0 or 207

Erase_Manager[*i*]=(Erase[*i*−1] AND Erase[*i*]) OR (Erase[*i*] AND Erase[*i*+1]), 1≦*i*≦206  (1)

The flag managing unit 33 updates the existing erase information according to Formula (1).

Referring to FIG. 13, when uncorrectable errors do not consecutively occur in at least three sequential row code words, an uncorrectable error or uncorrectable errors are ignored. When uncorrectable errors consecutively occur in at least three sequential row code words, the uncorrectable errors occurring in a top code word and a bottom code word of the sequential row code words are ignored, and the remaining row code words are indicated in error flags in operation 1301. When erase information based on error flags generated according to the conventional method is represented by Erase operation 1301 is represented by Erase_Manager[i], the relationship between the two types of erase information may be expressed by Formula (2).

Erase_Manager[i]=Erase[i], i=0 or 207

Erase_Manager[*i*]=(Erase_Manager[*i*−1] AND Erase_Manager[*i*])  (2)

AND (Erase_Manager[$i$] AND Erase_Manager[$i$+1]),
$1 \leq i \leq 206$

The flag managing unit 33 updates the existing erase information according to Formula (2).

The following description concerns the results of simulations performed to examine the effect of a decoding method employing error flag managing ways according to the present invention.

When a scratch having a length of about 3.936 mm occurs in a track direction on the surface of a DVD on which ECC blocks, each of which having 208 rows and 182 columns generated based on a Reed-Solomon Product Code, are recorded with a mark length of 3T (where T is a single period of a channel clock signal) set to 0.4 μm according to channel modulation, an error burst occurs throughout about 29520 channel bits=14760 data bits, that is, about 10 row code words.

When four-step error correction (row code word correction→column code word correction→row code word correction→column code word correction) is performed on an ECC block having errors as shown in FIGS. 7 and 8 according to a conventional decoding method, error correction on the ECC block is impossible regardless of how many times error correction is repeated. However, after the column code word correction in the second operation, if erase information Erase[i] obtained based on error flags generated according to the conventional decoding method in the first operation is transformed (managed) according to Formulas (1) and (2), and then column code word correction is performed again, error patterns of FIGS. 7 and 8 may be corrected.

Meanwhile, an algorithm for error flag management ignoring some of the errors may be variously specified. In the above embodiments, row code word correction is performed in the first operation during four-step error correction. However, it is apparent that column code word correction may also be performed in the first operation.

As described above, according to an embodiment of a decoding method and an apparatus of the present invention, errors may be corrected using error flag management that ignores some of the errors even if the errors cannot be corrected according to conventional technology.

Computer-executable instructions for performing the method of the present invention may be stored on a computer-readable medium. Thus, the present invention may be embodied in a program code, which can be read by a computer, on a computer-readable recording medium. The computer readable recording medium includes all kinds of recording apparatuses on which computer readable data are stored. The computer readable recording media includes storage media such as magnetic storage media (e.g., ROM's, floppy disks, hard disks, etc.), optically readable media (e.g., CD-ROMs, DVDs, etc.) and carrier waves (e.g., transmissions over the Internet). Also, the computer readable recording media can be transmitted to computer systems connected through a network, and the network can store and execute a computer readable code in a distributed mode.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of decoding data which has been encoded, the method comprising:

performing error correction on code words of an error correcting code block in one direction selected from a row direction and a column direction;

indicating in error flags only remaining code words in a selected direction, except at least some of the code words which are determined as having uncorrectable errors as a result of error correction performed on the code words in the selected direction; and performing error correction on code words in the other direction based on the error flags.

2. The method of claim 1, wherein the error flags are indicated in two sequential code words, only when uncorrectable errors occur consecutively in at least two sequential code words.

3. The method of claim 1, wherein uncorrectable errors that do not occur consecutively in at least three sequential code words are ignored, and when uncorrectable errors occur consecutively in at least three sequential code words, the uncorrectable errors occurring in a top code word and a bottom code word of the at least three sequential code words are ignored, and at least one remaining code word is indicated in an error flag.

4. The method of claim 1, wherein, during the performing error correction on code words in the other direction, uncorrectable errors are deemed to have occurred throughout data included in each of the code words indicated in the error flags.

5. A computer-readable medium having stored thereon computer-executable instructions for performing the method of claim 1.

6. A method of decoding data which has been encoded, the method comprising:

performing error correction on code words of an error correcting code block in a row direction;

indicating in error flags code words having uncorrectable errors;

performing error correction on code words of the error correcting code block in a column direction based on the error flags;

indicating in error flags only remaining code words in the row direction, except at least some of the code words which are determined as having uncorrectable errors as a result of error correction performed on code words of an error correcting code block in a row direction; and performing error correction on the code words of the error correcting code block in the column direction based on the error flags indicated in only the remaining code words in the row direction, except at least some of the code words having uncorrectable errors.

7. The method of claim 6, further comprising:

indicating in error flags code words having uncorrectable errors; and carrying out performing error correction on code words of an error correcting code block in a row direction based on the error flags obtained by indicating in error flags code words having uncorrectable errors.

8. The method of claim 7, wherein, when uncorrectable errors occur in at least two sequential code words, the error flags are indicated in the two sequential code words.

9. The method of claim 7, wherein uncorrectable errors that occur non-consecutively in at least three sequential code words are ignored, and when uncorrectable errors consecutively occur in at least three sequential code words, uncorrectable errors occurring in a top code word and a bottom code word of the at least three sequential code words are ignored, and at least one remaining code word is indicated in an error flag.

10. A computer-readable medium having stored thereon computer-executable instructions for performing the method of claim 6.

11. An apparatus comprising:
a reader, which reads data from an information storage medium;
a modulator, which performs channel demodulation on the read data and outputs demodulated data; and
a decoder, which generates an error correcting code block from the demodulated data, performs error correction on code words of the error correcting code block in one direction of row and column directions, indicates in error flags only a remaining code word/words in a selected direction except at least some of the code words which are determined as having uncorrectable errors as a result of error correction performed on the code words in the selected direction, and performs error correction on code words in the other direction based on the error flags.

12. The apparatus of claim 11, wherein the decoder indicates two sequential code words in the error flags when uncorrectable errors consecutively occur in at least said two sequential code words.

13. The apparatus of claim 11, wherein the decoder ignores uncorrectable errors that occur non-consecutively in at least three sequential code words, and when uncorrectable errors consecutively occur in at least three sequential code words, the decoder ignores uncorrectable errors occurring in a top code word and a bottom code word of said at least three sequential code words and indicates a remaining code word/words in an error flag.

14. The apparatus of claim 11, wherein the decoder performs error correction on the code words in the other direction, deeming that uncorrectable errors occur throughout data included in each of the code words indicated in the error flags.

15. An apparatus comprising:
an error correcting code (ECC) block generator, which generates an ECC block having code words;
an error corrector, which performs error correction on the code words of the ECC block in a row direction, performs error correction on code words of the error correcting code block in a column direction based on error flags obtained as a result of error correction performed on the code words in a row direction, and performs error correction again on the code words of the error correcting code block in the column direction based on error flags resulting from error flag management; and
a flag managing unit, which controls error flag management and indicates in error flags only remaining code words in the row direction, except at least some of the code words which are determined as having uncorrectable errors as a result of error correction performed on the code words in the row direction.

16. The apparatus of claim 15, wherein the flag managing unit indicates two sequential code words in error flags when uncorrectable errors consecutively occur in at least said two sequential code words.

17. The apparatus of claim 16, wherein, when there are 208 row code words, erase information based on error flags generated for uncorrectable errors is represented by Erase[i], and erase information based on error flags generated when uncorrectable errors consecutively occur in at least two sequential code words is represented by Erase_Manager[i], the flag managing unit performs error flag management according to a relationship expressed by:

Erase_Manager[$i$]=Erase[$i$], $i$=0 or 207

Erase_Manager[$i$]=(Erase[$i$−1] AND Erase[$i$]) OR (Erase[$i$] AND Erase[$i$+1]), $1 \leq i \leq 206$.

18. The apparatus of claim 15, wherein the flag managing unit ignores uncorrectable errors that occur non-consecutively in at least three sequential code words, and when uncorrectable errors consecutively occur in at least three sequential code words, the flag managing unit ignores uncorrectable errors occurring in a top code word and a bottom code word of the at least three sequential code words and indicates a remaining code word/words in an error flag.

19. The apparatus of claim 18, wherein, when there are 208 row code words, erase information based on error flags generated for uncorrectable errors is represented by Erase[i], and erase information based on error flags generated when uncorrectable errors consecutively occur in at least three sequential code words is represented by Erase_Manager[i], the flag managing unit performs error flag management according to a relationship expressed by:

Erase_Manager[$i$]=Erase[$i$], $i$=0 or 207

Erase_Manager[$i$]=(Erase_Manager[$i$−1] AND Erase_Manager[$i$]) AND (Erase_Manager[$i$] AND Erase_Manager[$i$+1]), $1 \leq i \leq 206$.

20. A computer-readable medium having stored thereon computer-executable instructions, the computer-executable instructions comprising:
reading data from an information storage medium;
performing channel demodulation on the data;
generating, from the data demodulated, an error correcting code block having code words;
performing error correction on the code words in one direction selected from a row direction and a column direction;
generating error flags based on occurrence of uncorrectable errors; and
performing error correction in the other direction based on the error flags,
wherein the error flags are generated only in remaining code words in a selected direction, except at least some of the code words which are determined as having uncorrectable errors as a result of error correction performed on the code words in the selected direction.

21. The computer-readable medium of claim 20, wherein the error flags are indicated in two sequential code words, only when uncorrectable errors consecutively occur in at least said two sequential code words.

22. The computer-readable medium of claim 20, wherein uncorrectable errors which do not occur consecutively in at least three sequential code words are ignored, and when uncorrectable errors occur consecutively in at least three sequential code words, uncorrectable errors occurring in a top code word and a bottom code word of said at least three sequential code words are ignored, and an error flag is indicated in a remaining code word/words.

23. The computer-readable medium of claim 20, wherein performing error correction in the other direction based on the error flags includes deeming that uncorrectable errors occur throughout data included in each of the code words indicated in the error flags.

24. A computer-readable medium having stored thereon computer-executable instructions, the computer-executable instructions comprising:
generating an error correcting code (ECC) block having code words;

performing error correction on code words of the ECC block in a row direction;

indicating in error flags code words having uncorrectable errors;

performing error correction on code words of the error correcting code block in a column direction based on the error flags; and performing error correction again on the code words of the error correcting code block in the column direction based on error flags resulting from error flag management; and wherein error flag management is performed by indicating in error flags only remaining code words in the row direction, except at least some of the code words which are determined as having uncorrectable errors as a result of error correction performed on the code words in the row direction.

25. The computer-readable medium of claim 24, wherein the performing error flag management includes indicating two sequential code words in error flags when uncorrectable errors consecutively occur in at least said two sequential code words.

26. The computer-readable medium of claim 25, wherein the performing error flag management includes, when there are 208 row code words, erase information based on error flags generated for uncorrectable errors is represented by Erase[i], and erase information based on error flags generated when uncorrectable errors consecutively occur in at least two sequential code words is represented by Erase_Manager[i], performing error flag management according to a relationship expressed by:

$$\text{Erase\_Manager}[i]=\text{Erase}[i], i=0 \text{ or } 207$$

$$\text{Erase\_Manager}[i]=(\text{Erase}[i-1] \text{ AND } \text{Erase}[i]) \text{ OR } (\text{Erase}[i] \text{ AND } \text{Erase}[i+1]), 1 \leq i \leq 206.$$

27. The computer-readable medium of claim 24, wherein performing error flag management includes ignoring uncorrectable errors that occur non-consecutively in at least three sequential code words, and when uncorrectable errors consecutively occur in at least three sequential code words, ignoring uncorrectable errors occurring in a top code word and a bottom code word of the at least three sequential code words and indicating remaining code word/words in an error flag.

28. The computer-readable medium of claim 27, wherein performing error flag management includes, when there are 208 row code words, erase information based on error flags generated for uncorrectable errors is represented by Erase[i], and erase information based on error flags generated when uncorrectable errors consecutively occur in at least three sequential code words is represented by Erase_Manager[i], performing error flag management according to a relationship expressed by:

$$\text{Erase\_Manager}[i]=\text{Erase}[i], i=0 \text{ or } 207$$

$$\text{Erase\_Manager}[i]=(\text{Erase\_Manager}[i-1] \text{ AND } \text{Erase\_Manager}[i]) \text{ AND } (\text{Erase\_Manager}[i] \text{ AND } \text{Erase\_Manager}[i+1]), 1 \leq i \leq 206.$$

29. A computer-readable medium having stored thereon computer-executable instructions, the computer-executable instructions comprising:

generating an error correcting code (ECC) block having code words;

performing error correction on code words of the ECC block in a column direction;

indicating in error flags code words having uncorrectable errors;

performing error correction on code words of the error correcting code block in a column direction based on the error flags;

performing error correction again on the code words of the error correcting code block in the row direction based on error flags resulting from error flag management; and wherein error flag management is performed by indicating in error flags only remaining code words in the column direction, except at least some of the code words which are determined as having uncorrectable errors as a result of error correction performed on the code words in the column direction.

30. A method of decoding data which has been encoded, the method comprising:

performing error correction on code words of an error correcting code block in one direction selected from a row direction and a column direction;

indicating in error flags only remaining code words in a selected direction, except at least some of the code words which are determined as having uncorrectable errors as a result of error correction performed on the code words in the selected direction, by ignoring uncorrectable errors that occur non-consecutively in at least three sequential code words, and when uncorrectable errors consecutively occur in at least three sequential code words, by ignoring uncorrectable errors occurring in a top code word and a bottom code word of the at least three sequential code words and indicating at least one remaining code word in an error flag; and performing error correction on code words in the other direction based on the error flags.

* * * * *